(12) United States Patent
Katz et al.

(10) Patent No.: US 11,694,977 B2
(45) Date of Patent: Jul. 4, 2023

(54) METHOD FOR PRODUCING A CONNECTION BETWEEN COMPONENT PARTS

(71) Applicant: OSRAM Opto Semiconductors GmbH, Regensburg (DE)

(72) Inventors: Simeon Katz, Regensburg (DE); Sophia Huppmann, Geldersheim (DE); Michael Hoenle, Parsberg (DE); Thorsten Wagner, Altenberg (AT); Kurt Hingerl, Wolfern (AT)

(73) Assignee: OSRAM Opto Semiconductors GmbH, Regensburg (DE)

( * ) Notice: Subject to any disclaimer, the term of this patent is extended or adjusted under 35 U.S.C. 154(b) by 198 days.

(21) Appl. No.: 17/046,209

(22) PCT Filed: May 8, 2019

(86) PCT No.: PCT/EP2019/061813
§ 371 (c)(1),
(2) Date: Oct. 8, 2020

(87) PCT Pub. No.: WO2019/224005
PCT Pub. Date: Nov. 28, 2019

(65) Prior Publication Data
US 2021/0035934 A1 Feb. 4, 2021

(30) Foreign Application Priority Data

May 25, 2018 (DE) .......................... 102018112586.0

(51) Int. Cl.
*H01L 23/48* (2006.01)
*H01L 23/00* (2006.01)

(52) U.S. Cl.
CPC .............. *H01L 24/05* (2013.01); *H01L 24/03* (2013.01); *H01L 24/80* (2013.01);
(Continued)

(58) Field of Classification Search
None
See application file for complete search history.

(56) References Cited

U.S. PATENT DOCUMENTS 6,596,640 B1 7/2003 Fishcer et al.
10,475,778 B2 11/2019 Pfeuffer et al.
(Continued)

FOREIGN PATENT DOCUMENTS

| DE | 102016104280 A1 | 9/2017 |
| WO | 2016193071 A1 | 12/2016 |
| WO | 2017153123 A1 | 9/2017 |

OTHER PUBLICATIONS

A. P. Hinterreiter, et al., "Surface pretreated low-temperature aluminum-aluminum wafer bonding," CrossMark, Microsyst Technol, Technical Paper, Aug. 18, 2017, 5 pages.
(Continued)

*Primary Examiner* — Hung K Vu
(74) *Attorney, Agent, or Firm* — Slater Matsil, LLP

(57) ABSTRACT

In an embodiment a method includes providing the first component part with a partially exposed first insulating layer, a plurality of first through-vias and an exposed first contact layer structured in places and planarized in places, wherein the first through-vias are each laterally enclosed by the first insulating layer, and wherein the first contact layer partially covers the first insulating layer and completely covers the first through-vias; providing the second component part with a partially exposed second insulating layer, a plurality of second through-vias and an exposed second contact layer structured in places and planarized in places, wherein the second through-vias are each laterally enclosed by the second insulating layer, and wherein the second contact layer partially covers the second insulating layer and completely covers the second through-vias and joining the component parts such that the contact layers overlap each
(Continued)

other thereby mechanically and electrically connecting the component parts to each other by a direct bonding process at the contact layers.

20 Claims, 7 Drawing Sheets

(52) U.S. Cl.
CPC ............ *H01L 2224/05025* (2013.01); *H01L 2224/05551* (2013.01); *H01L 2224/80896* (2013.01); *H01L 2224/80904* (2013.01)

(56) References Cited

U.S. PATENT DOCUMENTS

| | | | |
|---|---|---|---|
| 10,686,099 | B2 | 6/2020 | Huppmann et al. |
| 2004/0157407 | A1 | 8/2004 | Tong et al. |
| 2007/0096130 | A1* | 5/2007 | Schiaffino ............. H01L 33/382 |
| | | | 257/E33.074 |
| 2014/0264948 | A1* | 9/2014 | Chou ................ H01L 23/53228 |
| | | | 438/109 |
| 2019/0097088 | A1* | 3/2019 | Huppmann ............. H01L 24/00 |

OTHER PUBLICATIONS

B. Rebhan, et al., "Physical mechanisms of copper-copper wafer bonding," Journal of Applied Physics, J. Appl. Phys. 118, 135301 (2015); https://doi.org/10.1063/1.4932146, Oct. 1, 2015, 11 pages.
T. Plach, et al., "Mechanisms for room temperature direct wafer bonding," J. Appl. Phys. 113, 094905 (2013); doi: 10.1063/1.4794319, Mar. 7, 2013, 8 pages.

* cited by examiner

METHOD FOR PRODUCING A CONNECTION BETWEEN COMPONENT PARTS

This patent application is a national phase filing under section 371 of PCT/EP2019/061813, filed May 8, 2019, which claims the priority of German patent application 102018112586.0, filed May 25, 2018, each of which is incorporated herein by reference in its entirety.

TECHNICAL FIELD

A method for forming a connection between component parts is provided. Furthermore, a component made of component parts is provided.

BACKGROUND

In current chip technologies, aligned hybrid bonding is applied using insulating, transparent oxide layers and local metallic contact layers. Here, an exact planarization of the local metallic contact layers with the insulating transparent oxide layers play a crucial role. This is due to the fact that exact planarization can ensure both a mechanically stable connection and reliable electrical contact formation. If, however, the metallic contact layers are chosen to be small, for example, for minimizing light absorption, a very high adjustment effort is required.

SUMMARY

Embodiments provide a reliable and cost-efficient method for establishing a mechanical and electrical connection between component parts. Further embodiments provide a stable component made of component parts.

According to at least one embodiment of a method for producing a component from at least two component parts, a first component part and a second component part are provided. The component parts can each have a contact layer, which in particular is structured in places and is formed to be planar in places. For example, the contact layer of the first component part has several laterally spaced subregions which are assigned to different electrical polarities of the first component part. The contact layer of the second component part can be formed similar to the contact layer of the first component part.

A lateral direction is understood to mean a direction which is in particular parallel to a main extension surface of the first component part, of the second component part or of the first and/or the second contact layer. A vertical direction is understood to mean a direction that is in particular perpendicular to this main extension surface. The vertical direction and the lateral direction are for instance orthogonal to each other.

The subregions of the contact layers can be spaced apart from each other by lateral intermediate regions and electrically insulated from each other by these intermediate regions. The intermediate regions can be formed as lateral separation trenches between the subregions of the contact layers. Especially in this sense, the contact layers are structured. The subregions of the contact layers can each have an exposed surface which is preferably planar. Preferably, all subregions are planarized. For example, the planarized exposed surfaces of the subregions of the contact layers have an average roughness of at most 3 nm, 2 nm or at most 1 nm or 0.5 nm. For example, the mean roughness is given as RMS value (Root Mean Square). The exposed surfaces of the subregions can globally form a planar connection plane of the first or second component part. In this case, the exposed surfaces of the subregions can be globally for instance at the same vertical height. The globally planar connection plane of the first or second component part can have a mean roughness of at most 3 nm, 2 nm or at most 1 nm or 0.5 nm.

According to at least one embodiment of the method, contact layers can each be formed from a transparent and electrically conductive material. For example, the transparent and electrically conductive material is a transparent electrically conductive oxide (TCO). The contact layers can each be formed from InSnO, InZnO, AlSnO, ZnO, GaInO or similar materials.

Transparent electrically conductive oxides are transparent, conductive materials, usually metal oxides, such as zinc oxide, tin oxide, cadmium oxide, titanium oxide, indium oxide or indium tin oxide (ITO). Besides binary metal oxygen compounds, such as $ZnO$, $SnO_2$ or $In2O3$, ternary metal oxygen compounds, such as $Zn2SnO4$, $CdSnO3$, $ZnSnO3$, $MgIn2O4$, $GaInO3$, $Zn2In2O3$ or $In4Sn3O12$ or mixtures of different transparent conductive oxides belong to the group of TCOs. Furthermore, the TCOs do not necessarily correspond to a stoichiometric composition and can also be p-doped or n-doped.

According to at least one embodiment of the method, the component parts are brought together in such a way that the contact layers overlap in a plan view, as a result of which the component parts are mechanically and electrically connected to each other at the contact layers, which are planarized in places, by a direct bonding process. The first component part and the second component part in particular have exposed surfaces prepared in the same way.

In the direct bonding process, the contact layers in particular are directly adjacent to each other. In a direct bonding process, planarized surfaces, such as the surfaces of the contact layers, are brought into physical contact. The basis of the mechanical bond is mainly or exclusively hydrogen bonds and/or van-der-Waals interactions in the immediate vicinity of a common interface between the planarized surfaces. In order to form covalent bonds between atoms or molecules on the surfaces in physical contact, for example, a thermal treatment is applied subsequently for achieving an increased bond strength. The electrical connection between the component parts takes place especially during the direct bonding.

According to at least one embodiment of the method, the first component part is provided. The first component part may have a partially exposed first insulating layer. The first component part may have a plurality of first through-vias, which are laterally surrounded in particular by the first insulating layer. Along the vertical direction, the first through-vias can extend throughout the first insulating layer. In particular, the first component part has an exposed first contact layer which is structured and planarized in places. In top view of the component part, the first contact layer can partially cover the first insulating layer and completely cover the first through-vias.

The first through-vias can each be completely covered by one of the subregions of the first contact layer. It is possible that several first through-vias are covered by the same subregion of the first contact layer. For example, the first through-vias are each electrically connected to one of the subregions of the first contact layer. In a top view of the first component part, the first contact layer can partially cover the first insulating layer in such a way that the first insulating layer is freely accessible in the intermediate regions between the subregions of the first contact layer. In other words, the first insulating layer may be exposed in the intermediate regions between the subregions of the first contact layer.

According to at least one embodiment of the method, the second component part is provided in particular with a partially exposed second insulating layer. The second component part may have a plurality of second through-vias. The second component part can be formed analogous to the first component part. In particular, the second component part has an exposed second contact layer which is structured and planarized in places. Analogous to the first component part, the second through-vias can be laterally enclosed by the second insulating layer. In a plan view, the second contact layer can partially cover the second insulating layer and completely cover the second through-via. In the intermediate regions between the subregions of the second contact layer, the second insulating layer can be freely accessible. In the remaining regions, the insulating layer can be completely covered by the second contact layer.

Before the component parts are joined, the first component part and the second component part may each have an exposed surface. The exposed surface of the first component part or of the second component part may be formed of surfaces, in particular exclusively of surfaces of the first contact layer and of the first insulating layer or of the second insulating layer and of the second contact layer. The exposed surface of the first or second component part may have planarized subregions and recesses, wherein the recesses are formed in particular due to the fact that the contact layer does not cover the insulating layer. The recesses can each have a vertical depth which corresponds in particular to the vertical layer thickness of the corresponding contact layer. In other words, the exposed, in particular planarized surfaces of the first/second contact layer may be vertically elevated compared to the exposed surfaces of the first/second insulating layer, namely by the vertical layer thickness of the corresponding contact layer. The in particular globally planarized exposed surface of the first or second component part having local recesses is preferably composed exclusively of surfaces of the contact layer and of the insulating layer.

According to at least one embodiment of the method, a common interface is formed between the component parts when the component parts are joined together. The common interface is in particular a common connection plane, which is preferably formed exclusively by the overlapping of the planarized surfaces of the first and of the second contact layer. At the common interface between the component parts, step transitions between the first contact layer and the second contact layer can be formed. If the recesses of the surfaces of the component parts are adjacent to each other, cavities can be formed between the component parts. It is possible that a subregion of the first and/or the second contact layer is laterally surrounded, in particular laterally completely enclosed by a cavity. In particular, the cavity is free of a medium in a liquid or solid aggregate state. The cavity can be filled with a gaseous medium, such as air or an inert gas.

In at least one embodiment of a method for forming a mechanical and electrical connection between a first component part and a second component part, the first component part and the second component part are provided. The first component part has a partially exposed first insulating layer, a plurality of first through-vias and an exposed first contact layer which is structured in places and planarized in places, wherein the first through-vias are each laterally enclosed by the first insulating layer. The first contact layer can partially cover the first insulating layer and completely cover the first through-vias. The second component part has a partially exposed second insulating layer, a plurality of second through-vias and an exposed second contact layer which is structured and planarized in places. The second through-vias are each laterally enclosed by the second insulating layer. The second contact layer can partially cover the second insulating layer and completely cover the second through-vias. The component parts are joined together such that the contact layers overlap in a plan view, as a result of which the component parts are mechanically and electrically connected to each other by a direct bonding process at the contact layers, which are planarized in places.

In such a method, direct bonding is preferably performed exclusively on the surfaces of the first and second contact layers. In particular, the first insulating layer is only indirectly adjacent to the second insulating layer. At the overlapping regions, the first insulating layer is vertically spaced from the second insulating layer by the first and the second contact layer. In the regions of the recesses, the first insulating layer can be vertically spaced from the second insulating layer by a cavity. The first through-vias are mechanically and electrically connected to the second through-vias via the contact layers.

At the connection plane between the first and the second component parts, i.e., at the common interface, the first contact layer directly adjoins the second contact layer. Thus, the first contact layer is electrically connected to the second contact layer. The first contact layer and the second contact layer may each have several subregions laterally spaced from each other, wherein each subregion of the first contact layer may directly adjoin a corresponding subregion of the second contact layer and in particular, is laterally spaced and electrically isolated from the further subregions of the second contact layer. For example, each of the subregions of the first contact layer directly adjoins exactly one subregion of the second contact layer, and vice versa.

According to at least one embodiment of the method, the first contact layer and the second contact layer are each a structured, transparent and electrically conductive oxide layer. By completely covering the through-vias with the contact layer, the total area covered by the normally radiopaque through-vias can be kept small.

The use of such contact layers also simplifies the planarization step, as possible local unevenness of a hybrid structure can be compensated for by the contact layer. In this case, the hybrid structure can be a structure made of the through-vias and the associated insulating layer. The local unevenness of the hybrid structure can be vertical step transitions between the insulating layer and the through-vias.

In addition, the first component part or the second component part can be formed in such a way that a lower adjustment accuracy is required when the component parts are joined together. The total area covered by the through-vias can be kept small, wherein the use of radiation-transmissive contact layers, which completely cover the through-vias in a plan view, does not result in large radiation-absorbing areas, as is the case with purely metallic hybrid approaches.

According to at least one embodiment of the method, the first/second insulating layer has exposed regions that remain non-covered by the first/second contact layer. Along a vertical direction, the first contact layer thus protrudes at least locally beyond the exposed regions of the first insulating layer. Similarly, along a vertical direction, the second contact layer protrudes at least locally beyond the exposed regions of the second insulating layer. Along the lateral direction, the exposed regions of the first/second insulating layer in particular directly adjoin the first/second contact layer.

In a plan view of the exposed surface of the component part, a contiguous exposed region of the first insulating layer may completely surround a subregion of the first contact layer. The first insulating layer may have a plurality of such exposed contiguous regions, each of which completely surrounds one of the subregions of the first contact layer in a plan view. Similarly, the second insulating layer may have a plurality of such exposed contiguous regions, each of which laterally encloses one of the subregions of the second contact layer. In particular, the exposed regions of the insulating layer each form an intermediate region which electrically separates a subregion of the contact layer from adjacent subregions of the same contact layer.

According to at least one embodiment of the method, the component parts each have a main body. For example, the main body comprises a carrier, a growth substrate, a semiconductor body, an epitaxial wafer structure, an LED wafer structure and/or a carrier for an LED wafer structure. The first/second component part can be a semiconductor wafer or a drive-wafer, which comprises for example a semiconductor body and/or a carrier in particular comprising electrical contact elements or electronic drive elements, for example CMOS elements.

According to at least one embodiment of the method, the first insulating layer and/or the second insulating layer are/is planarized at least in places. The component parts can each have a main body on which the corresponding insulating layer is formed. Preferably, the first insulating layer or the second insulating layer is a structured, electrically insulating and especially transparent layer.

For example, the insulating layers are each made of a radiation-transmissive material such as silicon oxide or aluminum oxide. The first/second insulating layer may have openings that extend in particular throughout the first/second insulating layer. For example, one through-via is arranged in each of the respective openings. In this sense, the insulating layer and the corresponding through-vias form a hybrid layer. The hybrid layer can be planar.

The first/second insulating layer can be applied to the main body of the component part by sputtering, vapor deposition or by an Atomic Layer Deposition (ALD) process. Its roughness, for example of at most 3 nm, 2 nm, 1 nm or 0.5 nm, can either meet the requirements for direct bonding directly after deposition or it can be achieved by a planarization process, for example by chemical-mechanical polishing. To form the through-vias, structured areas, especially openings of the insulating layer, are filled with an electrically conductive material, for example, with Cu, Ni, Al, W, Au, Ag, etc.

The application of the electrically conductive material, such as a metal, can be carried out by a deposition process such as sputtering, vapor deposition or ALD. After the through-vias have been formed, they can be planarized, for example by a chemical-mechanical polishing process. Alternatively, it is possible that the through-vias are first applied in a structured manner to the main body of the corresponding component part, whereupon the electrically insulating and radiation-transmitting insulating layer is deposited on the main body of the component part and planarized. The through-vias and the corresponding insulating layer can be planarized in a common process step. This forms a hybrid surface from the exposed surfaces of the through-vias and the insulating layer. For example, the hybrid surface has an average roughness of 10 nm, 3 nm, 2 nm, 1 nm or 0.5 nm at most. In a subsequent method step, the first/second contact layer can be formed on the hybrid surface in such a way that the first/second contact layer covers the through-vias completely and the insulating layer partially.

According to at least one embodiment of the method, the first insulating layer and/or the second insulating layer can be planarized in places and can have local recesses and/or local elevations in places. The local recesses and/or local elevations of the insulating layer may be formed in the exposed regions of the insulating layer which are not covered or remain non-covered by the contact layer in a plan view.

According to at least one embodiment, the contact layer is applied to the hybrid surface from the surfaces of the through-vias and the insulating layer. For example, the contact layer is deposited in a structured manner. Alternatively, it is possible that the contact layer is first deposited in a flat manner on the hybrid surface and then structured to form a plurality of subregions. Similar to the insulating layer, the roughness of the contact layer can meet the requirements for direct bonding directly after deposition, for example due to a low layer density of the contact layer. It is also possible that the required largest roughness for a direct bonding process can be achieved subsequently by planarization, for example using a chemical-mechanical polishing process.

According to at least one embodiment of the method, the roughness of the first contact layer, the second contact layer, the first insulating layer, the second insulating layer and/or of the hybrid surface of the surfaces of the through-vias and of the insulating layers is at most 3 nm, preferably at most 2 nm or 1 nm, particularly preferably at most 0.5 nm.

According to at least one embodiment of the method, the main body of the first component part or of the second component part comprises a carrier. It is possible that transistors or electrical circuits are integrated in the carrier or formed in the carrier. It is also possible that electrical tracks are arranged on the carrier. In particular, the through-vias are electrically connected to the electrically conductive structures of the carrier. It is also possible that the main body has a semiconductor body. The semiconductor body can have a first semiconductor layer, a second semiconductor layer and/or an active zone arranged therebetween, wherein the active zone is particularly configured for the generation or detection of electromagnetic radiation during operation of the component part. The through-vias are especially formed for electrical contacting of the semiconductor body.

According to at least one embodiment of the method, the mechanical connection between the first component part and the second component part is based on van-der-Waals interactions, i.e., on atomic interactions. In particular, the first contact layer directly adjoins the second contact layer. A common interface, e.g. a common connection plane, is formed between the contact layers which are planarized in places. In a direct bonding process, the common interface or the common connection plane is especially free of an additional connection material, such as solder or an adhesion promoter. In particular, the common interface is an overlapping surface between the planarized subregions of the exposed surfaces of the contact layers, which is formed when the component parts are joined together.

According to at least one embodiment of the method, the first contact layer and the second contact layer each have a plurality of laterally spaced subregions. Intermediate regions can be arranged between the subregions of the same contact layer, wherein the intermediate regions spatially and electrically separate adjacent subregions of the contact layer. In the intermediate regions, the first insulating layer or the second insulating layer is exposed. In other words, the first insulating layer or the second insulating layer in the intermediate regions is freely accessible and remains non-covered, especially by the first contact layer or the second contact layer.

According to at least one embodiment of the method, a cavity or a plurality of cavities is/are formed in the vertical direction between the first component part and the second component part. In lateral directions, the cavity can completely surround a first through-via and/or a second through-via. The cavity or the cavities is/are formed in particular by joining the intermediate regions of the first contact layer and the second contact layer. Vertical elevations and/or vertical recesses of the first insulating layer and/or the second insulating layer can be arranged in the cavity or cavities. The vertical elevations or the vertical recesses can be formed to prevent an electrical breakdown between two adjacent subregions of the first/second contact layer assigned to different electrical polarities.

In at least one embodiment of the component, the component has a first component part and a second component part. The first component part has a first insulating layer, a plurality of first through-vias and a contact layer structured in places. The first through-vias are each laterally enclosed by the first insulating layer, wherein the first contact layer partially covers the first insulating layer and completely covers the first through-vias. The second component part has a second insulating layer, a plurality of second through-vias and a second contact layer structured in places. The second through-vias are laterally enclosed by the second insulating layer, wherein the second contact layer partially covers the second insulating layer and completely covers the second through-vias. A mechanical and electrical connection between the component parts is formed especially at the contact layers, wherein the connection is based on van-der-Waals-interactions.

The mechanical and electrical connection is thus formed at a common interface between the structured contact layers. In particular, the contact layers are each formed of a radiation-transmitting and electrically conductive material. Such van-der-Waals-interaction based connections usually result from a direct bonding process. Since the van-der-Waals-interactions take place exclusively at the common interface between the planarized subregions of the structured contact layers of the same material, the planarization of the structured contact layers can be simplified compared to the planarization of a hybrid surface.

According to at least one embodiment of the component, the cavities are formed in the vertical direction between the first component part and the second component part. In sectional view, the cavities can have the shape of a step along the vertical direction. Such steps are characteristic features of a direct bonding process, because the contact layers or the subregions of the contact layers are usually not flush with each other when the component parts are joined. Moreover, the subregions of the first contact layer and the corresponding subregions of the second contact layer may have different cross sections.

According to at least one embodiment of the component, the cavities enclose each a subregion of the first and/or of the second contact layer in lateral directions. In other words, a cavity can completely surround its associated subregion of the first and/or second contact layer. Each of the subregions of the contact layer can completely cover at least one of the through-vias. The subregions, each of which is laterally surrounded by a cavity, can each completely cover exactly one of the through-vias.

According to at least one embodiment of the component at least one cavity is formed in the vertical direction between the first component part and the second component part. The cavity is located in the lateral direction especially between two adjacent subregions of the contact layers. In particular, the cavity is formed so wide that an electrical breakdown between the two adjacent subregions of the contact layer or layers is prevented. The cavity can be filled with air or with an inert gas. It is possible that the two adjacent subregions of the same contact layer are assigned to different electrical polarities of the corresponding component part. It is also possible that one subregion of the contact layer is assigned to a first electrical polarity of the component part and the adjacent subregion of the same contact layer is potential-free and is not assigned to any of the electrical polarities of the component part.

According to at least one embodiment of the component, the first insulating layer and/or the second insulating layer have/has at least one local recess or at least one local elevation. The local recess or the local elevation can be formed in one of the cavities between the component parts. In the presence of the local recess or elevation of the first and/or the second insulating layer, the cavity is branched or stepped in places which prevents electrical breakdown between adjacent subregions of the contact layers to a great extent.

According to at least one embodiment of the component, the local elevation of one insulating layer extends into the local recess of the other insulating layer. The local elevation of one insulating layer thus forms a kind of separating wall between the subregions of the contact layers. An electrical insulation between the subregions of the contact layers or the same contact layer is thus enforced.

According to at least one embodiment of the component, the first contact layer or the second contact layer has a contiguous subregion and several further subregions. The further subregions can be enclosed by the contiguous subregion in the lateral directions. The contiguous subregion and the further subregions of the same contact layer can be assigned to different polarities of the component part. It is also possible that the contiguous subregion remains potential-free and that the further subregions are assigned to different electrical polarities of the associated component part. In other words, the contiguous subregion can be electrically neutral. Some of the further subregions can be assigned to a first electrical polarity of the component, while the remaining subregions are assigned to a second electrical polarity of the component part or of the component which is different from the first electrical polarity. If the contiguous subregion is assigned to a first electrical polarity of the component, the further subregions, in particular all further subregions, can be assigned to a second electrical polarity of the component part or of the component which is different from the first electrical polarity.

The method described here for producing a mechanical and electrical connection between two component parts is particularly suitable for the production of a component made of the component parts described here. The features described in connection with the component or with the component part can therefore also be used for the method, and vice versa.

BRIEF DESCRIPTION OF THE DRAWINGS

Further preferred embodiments and further developments of the component, the composite component and of the method will become apparent from the exemplary embodiments explained below in conjunction with FIGS. 1A to 4.

DETAILED DESCRIPTION OF ILLUSTRATIVE EMBODIMENTS

Figure 1A:
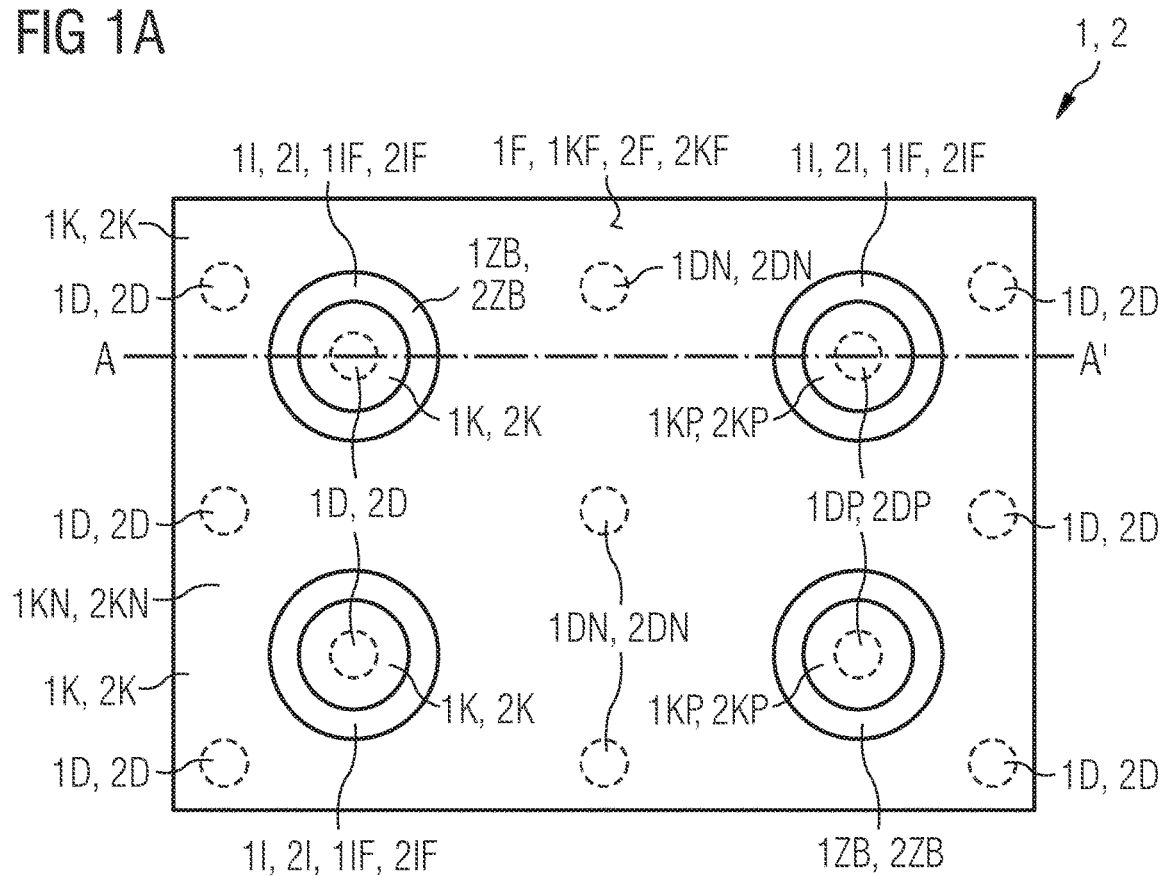
FIG. 1A shows a first component part or a second component part in a plan view of the exposed surface of the contact layer or insulating layer.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

FIG. 1A schematically shows the first component part 1 or the second component part 2 in a plane view of the first contact layer 1K or of the second contact layer 2K. In addition to the first contact layer 1K or the second contact layer 2K, the first component part 1 or the second component part 2 has a first insulating layer 1I and a plurality of through-vias 1D or a second insulating layer 2I and a plurality of second through-vias 2D.

As shown in FIG. 1A, the contact layer 1K or 2K has a contiguous subregion 1KN or 2KN. In addition, the contact layer 1K or 2K has a plurality of further subregions 1KP or 2KP, wherein the further subregions 1KP/2KP are laterally spaced from each other and from the contiguous subregion 1KN/2KN. The contiguous subregion 1KN or 2KN can be assigned to a first electrical polarity of the component part 1 or 2. For example, the contiguous subregion 1KN or 2KN forms an n-contact layer of the first component part 1 or of the second component part 2. The contiguous subregion 1KN or 2KN can completely cover a plurality of first through-vias 1D or a plurality of second through-vias 2D in a plan view. The through-vias 1D or 2D covered by the contiguous subregion 1KN or 2KN can be formed as n-sided through-vias 1DN or 2DN of the first component part 1 or of the second component part 2.

The laterally spaced further subregions 1KP or 2KP can be assigned to the second electrical polarity of the first component part 1 or of the second component part 2. Each of the further subregions 1KP and 2KP covers at least one, in particular exactly one first through-via 1DP or 2DP completely. Compared to the through-via 1D/2D, the subregion 1KP/2KP may have a larger cross-section, for example a cross-section being at least 2 times, 4 times or 6 times larger. The through-via 1DP or 2DP can be formed as p-sided through-via of the first component part 1 or of the second component part 2.

As shown in FIG. 1A, each of the further subregions 1KP/2KP of the contact layer 1/2 is completely surrounded by an exposed region 1IF or 2IF of the first insulating layer 1I or of the second insulating layer 2I. The first insulating layer 1I or the second insulating layer 2I has a plurality of such exposed regions 1IF or 2IF. According to FIG. 1A, the exposed regions 1IF or 2IF serve as electrical separation between the contiguous subregion 1KN and the further subregions 1KP of the first contact layer 1K or between the contiguous subregion 2KN and the further subregions 2KP of the second contact layer 2K.

The first component part 1 has an exposed surface 1F. The exposed surface 1F is formed in particular exclusively by the exposed surfaces of the first contact layer 1KF and by the surfaces of the exposed regions 1IF of the first insulating layer 1I. The second component part 2 has an exposed surface 2F. In particular, the exposed surface 2F is formed exclusively by exposed surfaces of the subregions 2KN and 2KP of the second contact layer 2K and by surfaces of the exposed regions 2IF of the second insulating layer 2I.

According to FIG. 1A, the exposed surface 1F of the first component part 1 or of the exposed surface 2F of the second component part 2 is structured in places, wherein the intermediate regions 1ZB or 2ZB are located between the subregions 1KN and 1KP or between the subregions 2KN and 2KP of the contact layer 1K or 2K. The intermediate regions 1ZB/2ZB form in particular local recesses on the exposed surface 1F/2F. Inside and/or outside the recesses, the exposed surface 1F/2F can be locally planar. Except for the intermediate regions 1ZB or 2ZB, the first insulating layer 1I and the second insulating layer 2I can be completely covered by the first contact layer 1K and the second contact layer 2K, respectively.

Figure 1B:
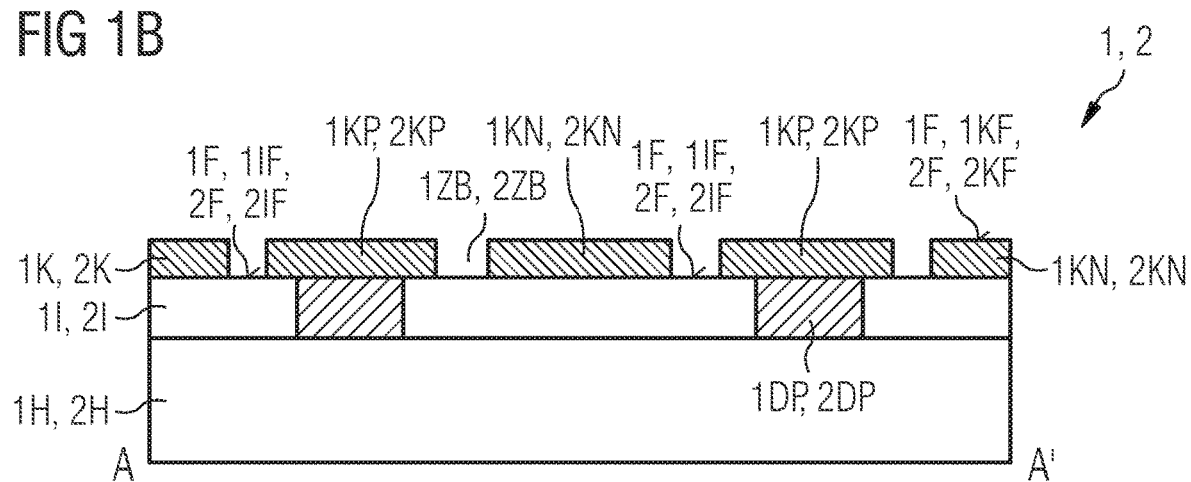
FIGS. 1B, 1C, 1D, 1E and 1F show schematic illustrations of some exemplary embodiments for the first component part or for the second component part.

According to FIG. 1B, the first component part 1 or the second component part 2 is shown schematically in sectional view along the sectional plane AA'. The first component part 1 and the second component part 2 can each have a main body 1H or 2H. The main body 1H/2H can have a carrier and/or a semiconductor body. As shown in FIG. 1B, the through-vias 1D or 2D are completely enclosed in lateral directions by the first insulating layer 1I or by the second insulating layer 2I. In the vertical direction, the through-vias 1D/2D may extend throughout the insulating layer 1I/2I. In a plan view, each of the through-vias 1D/2D is completely covered by a subregion 1KP, 2KP, 1KN or 2KN of the contact layer 1K/2K. In the intermediate regions 1ZB/2ZB, the insulating layer 1I/2I is not covered by the contact layer 1K/2K. The exposed surface 1F or 2F thus has corresponding recesses in the intermediate regions 1ZB or 2ZB. Outside the recesses, the exposed surface 1F/2F is formed exclusively by the surfaces of the contact layer 1K/2K and is preferably globally planar.

Figure 1C:
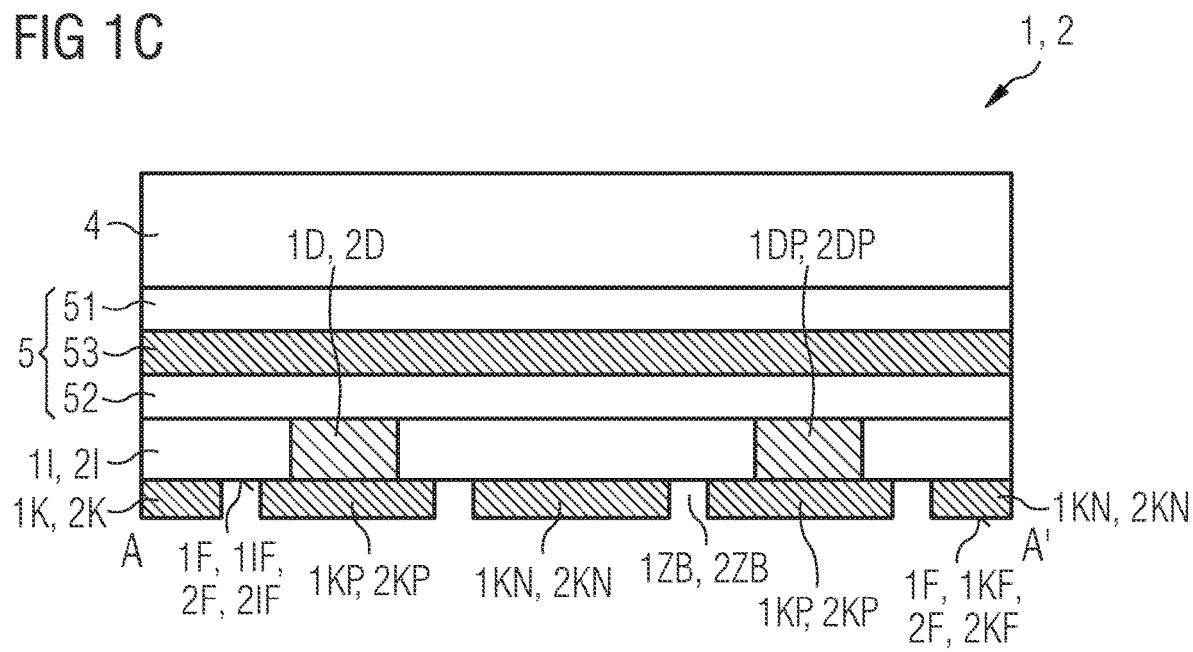

The exemplary embodiment shown in FIG. 1C essentially corresponds to the exemplary embodiment shown in FIG. 1B of the first component part 1 or of the second component part 2. In contrast, FIG. 1C shows that the main body 1H or 2H can have a carrier 4 and a semiconductor body 5. The semiconductor body 5 can have a first semiconductor layer 51 and a second semiconductor layer 52. An active zone 53 is arranged between the first semiconductor layer 51 and the second semiconductor layer 52, wherein the active zone 53 is configured in particular for generating or detecting electromagnetic radiation during operation of the component part 1 or 2.

Figure 1D:
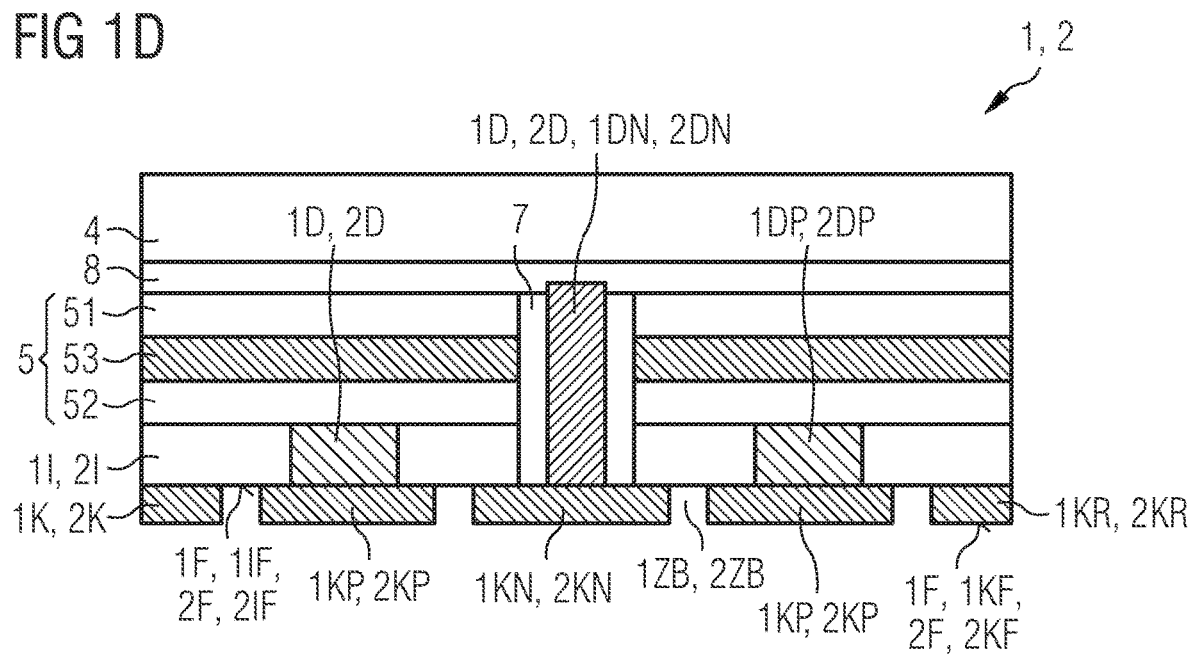
Figure 1E:
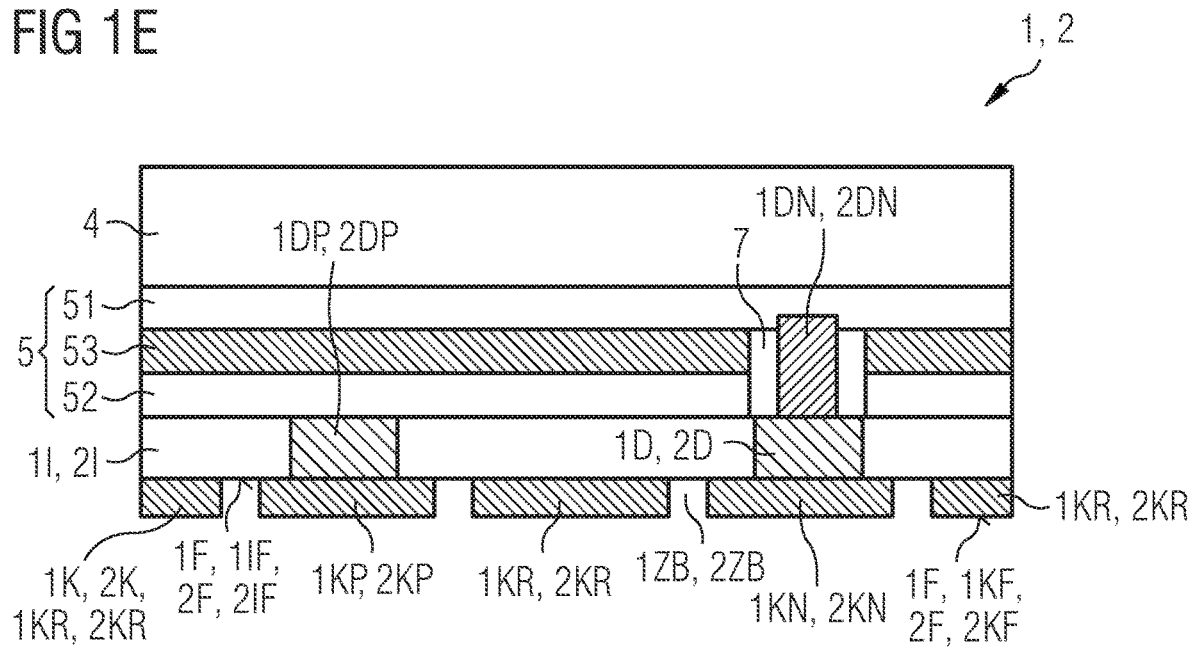
Figure 1F:
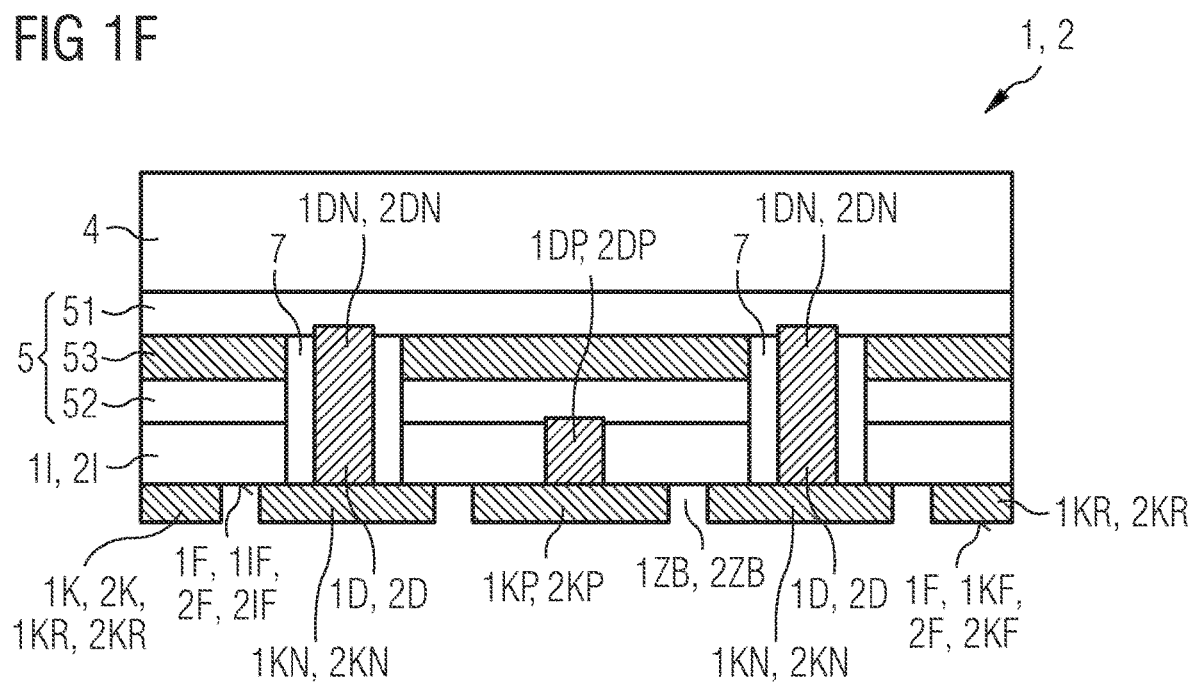

The through-vias 1D or 2D are formed especially for the electrical contacting of the main body 1H or 2H. For example, the through-vias 1DP or 2DP are formed for electrical contacting of the second semiconductor layer 52. The through-vias 1DN or 2DN can be formed for electrical contacting of the first semiconductor layer 51. The through-vias 1DP or 2DP can be formed as p-sided through-vias of the first component part 1 or of the second component part 2. The through-vias 1DN or 2DN can be formed as n-sided through-vias of the first component part 1 or of the second component part 2. Some possible through-vias 1DN or 2DN are schematically shown in FIGS. 1D, 1E and 1F. The 1DN/2DN through-vias can be made in one piece or in multiple pieces.

According to FIG. 1D, the through-via 1DN or 2DN can extend throughout the semiconductor body 5 to a connection layer 8. The connection layer 8 can be formed as a current expansion layer of the component part 1 or 2, wherein the connection layer 8 is electrically conductively connected in particular to the first semiconductor layer 51 of the semiconductor body 5. For the electrical isolating of the through-vias 1DN or 2DN from the second semiconductor layer 52 or from the active zone 53, a passivation layer 7 may be partially formed within the semiconductor body 5 in such a way that the passivation layer 7 completely encloses the through-via 1DN or 2DN.

In contrast to FIG. 1D, the through-via 1DN or 2DN can be formed according to FIG. 1E in such a way that it only extends throughout the second semiconductor layer 52 and the active zone 53 into the first semiconductor layer 51. According to FIG. 1F, the component part 1 or 2 can have a plurality of such through-vias 1DN or 2DN.

In FIGS. 1D, 1E and 1F, the first contact layer 1K may have one or more subregions 1KN of first electrical polarity, one or more subregions 1KP of second electrical polarity and one or more further subregions 1KR. The further subregion 1KR or the plurality of further subregions 1KR can be assigned to the first electrical polarity or to the second electrical polarity of the component part 1. Alternatively, it is possible that the further subregion 1KR of the first contact layer 1K is electrically neutral.

Completely analogous to the first component part 1, the second component part 2 can have a structured second contact layer 2K, wherein the second contact layer 2K can be divided into subregions 2KN of first electrical polarity, subregions 2KP of second electrical polarity and further subregions 2KR. Entirely analogous to the further subregions 2KR of the first contact layer 1K, the further subregions 2KR of the second contact layer 2K can be assigned to the first polarity or to the second polarity of the second component part 2 or can be electrically neutral.

Figure 2A:
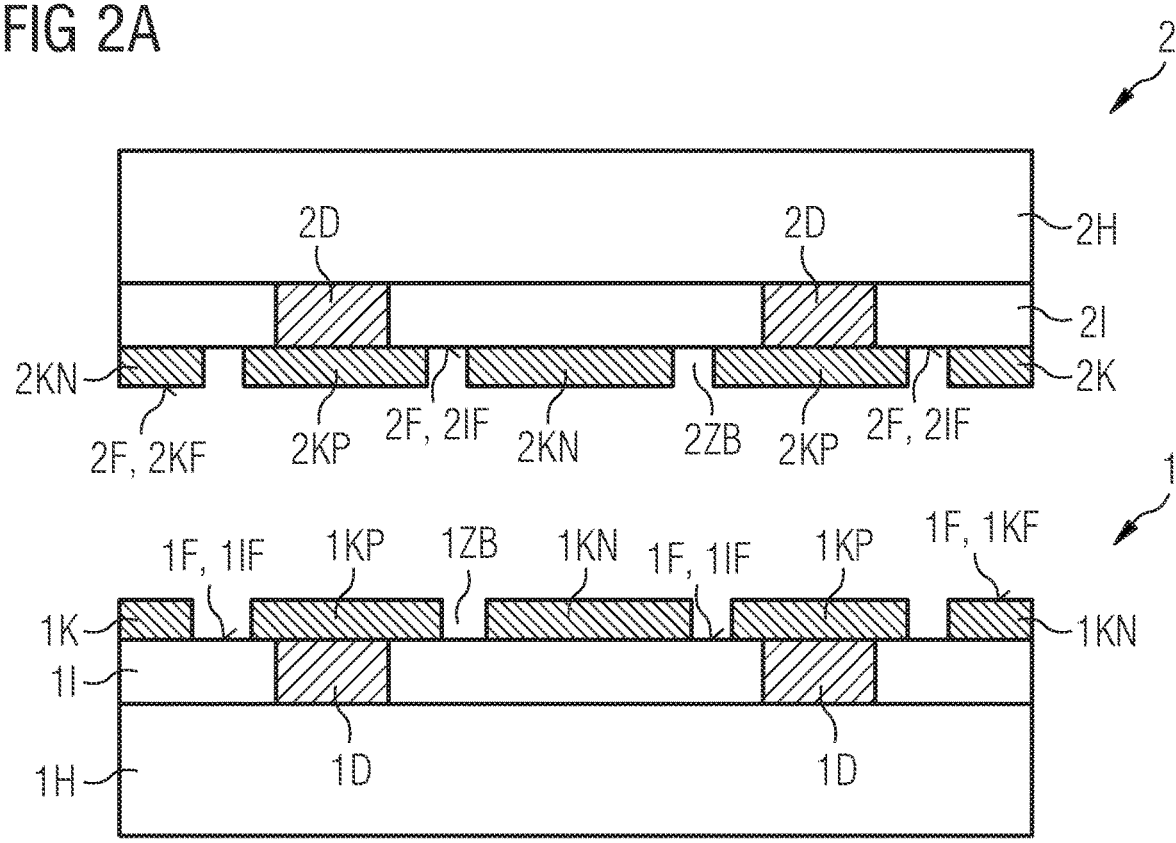
FIG. 2A shows schematic illustrations of the method step for joining the first and second component parts.

According to FIG. 2A, the first component part 1 and the second component part 2 are joined together for forming the component 10. In particular, the mechanical and electrical connection between component parts 1 and 2 is achieved without using an additional connecting layer. The connection between the component parts 1 and 2 is based in particular exclusively on van-der-Waals interactions between the first contact layer 1K and the second contact layer 2K. In particular, the component parts 1 and 2 are joined together in such a way that the exposed regions of planar surfaces 1F and 2F touch each other.

Prior to the bonding process, the crystalline properties of the contact layers 1K and 2K, which are formed in particular from a transparent electrically conductive material, can be optimized by a temperature treatment, for example at a temperature between too ° C. and 900° C. inclusive, in an O2 and/or N2 atmosphere and/or by a plasma treatment. The plasma treatment includes for example RIE (Reactive Ion Etching) or ICP (Inductively Coupled Plasma) with N2, O2 or Ar plasma. Alternatively or additionally, the surface properties of the contact layers 1K and 2K can be optimally prepared by a cleaning step. The bonding is carried out by direct bonding, preferably with similar prepared component parts 1 and 2. The component parts 1 and 2 can each have a main body 1H or 2H, respectively, wherein the main body 1H or 2H has a carrier 4, 41, 42 and/or a semiconductor body 5 or 6. Optionally, the bond connection can be strengthened by a subsequent temperature treatment.

According to FIG. 2A, the exposed surface 1F of the first component part 1 is formed exclusively by surfaces of the first contact layer 1K and of the first insulating layer 1I. The exposed surface 2F of the second component part can be formed exclusively by the surfaces of the second contact layer 2K and of the second insulating layer 2I. Since the insulating layers 1I and 2I are only exposed in the intermediate regions 1ZB and 2ZB and the intermediate regions 1ZB and 2ZB are not covered by the contact layer 1K or 2K, the first insulating layer 1I remains vertically spaced from the surface 2F of the second component part 2 after bonding. Similarly, the second insulating layer 2I remains vertically spaced from the exposed surface 1F of the first component part 1 after bonding.

Figure 2B:
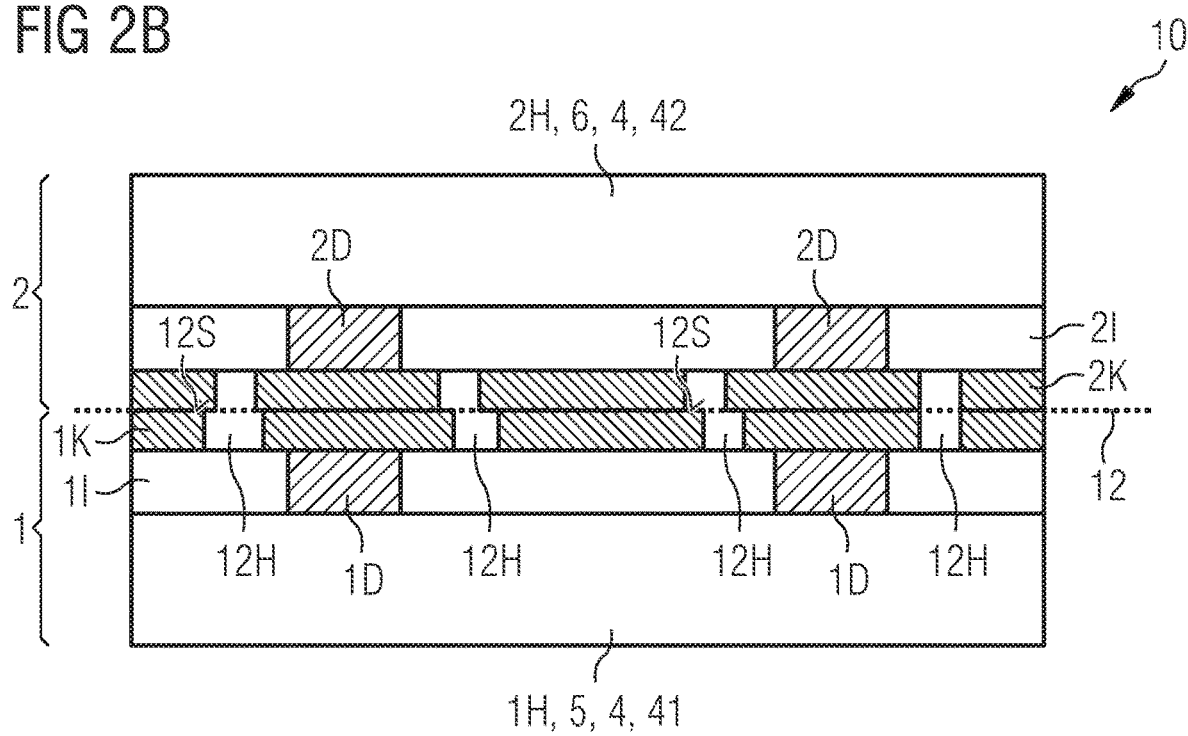
FIGS. 2B, 2C, 2D, 3A, 3B and 3C show schematic illustrations of some exemplary embodiments of a component in sectional views.

According to FIG. 2B, the component 10 has a common interface 12 or a common connection plane 12 between the first component part 1 and the second component part 2. In particular, the common interface 12 is formed exclusively by the planarized surfaces of the first contact layer 1K and of the planarized surfaces of the second contact layer 2K. Via the first contact layer 1K and the second contact layer 2K, the first through-vias 1D are electrically connected to the second through-vias 2D. Since both the first contact layer 1K and the second contact layer 2K are structured and cavities 12H are formed between the first component part 1 and the second component part 2, a first through-via 1D is electrically conductively connected only to the corresponding second through-via 2D. The first through-via 1D can be electrically isolated from the other second through-vias 2D.

As shown in FIG. 2B, in the regions of the cavities 12H, steps 12S or step transitions 12S are formed at the common interface 12. Such steps 12S or step transitions 12S at the common interface 12 are characteristic for a direct bond process. In a direct bonding process, the common interface 12 or the connection plane 12 is free of a bonding material, such as a solder material or an adhesion promoter material.

FIG. 2B indicates that the first main body 1H or the second main body 2H may have a carrier 41 or 42 and/or a semiconductor body 5 or 6. If the component part 1/2 is a semiconductor wafer, the component 10 can be separated into smaller components, such as individual semiconductor chips. Deviating from FIG. 2B, it is possible to fix several first component part 1 on a single second component part 2, or vice versa.

Figure 2C:
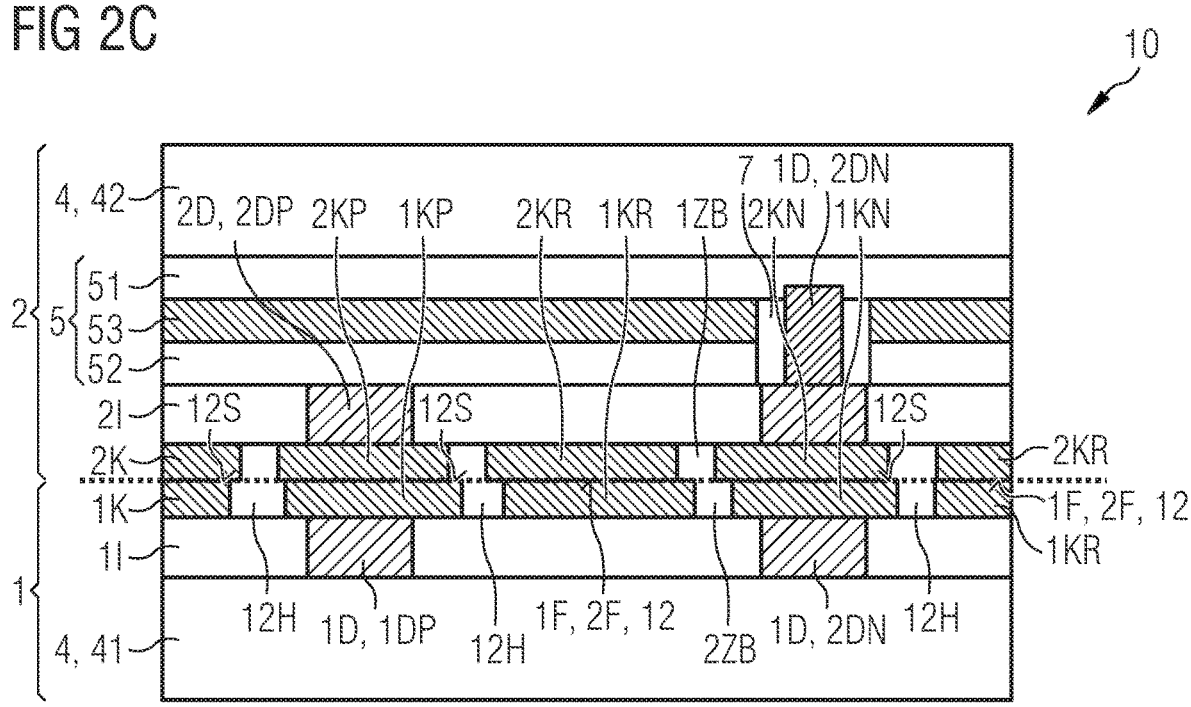

The exemplary embodiment shown in FIG. 2C essentially corresponds to the exemplary embodiment for a component 10 shown in FIG. 2B. In contrast, the main body 1H of the first component part 1 only has a carrier 4 or 41. The second component part 2 in FIG. 2C corresponds to the component part 2 shown in FIG. 1E. In this case, the component part 2 has a carrier 4 or 42 and a semiconductor body 5 on the carrier. The carrier 42 can be a growth substrate. In the first carrier 41, transistors can be arranged or formed which are configured for instance to drive the semiconductor body 5. The semiconductor body 5 can be structured and can have several individually connectable and thus individually controllable partial bodies.

Figure 2D:
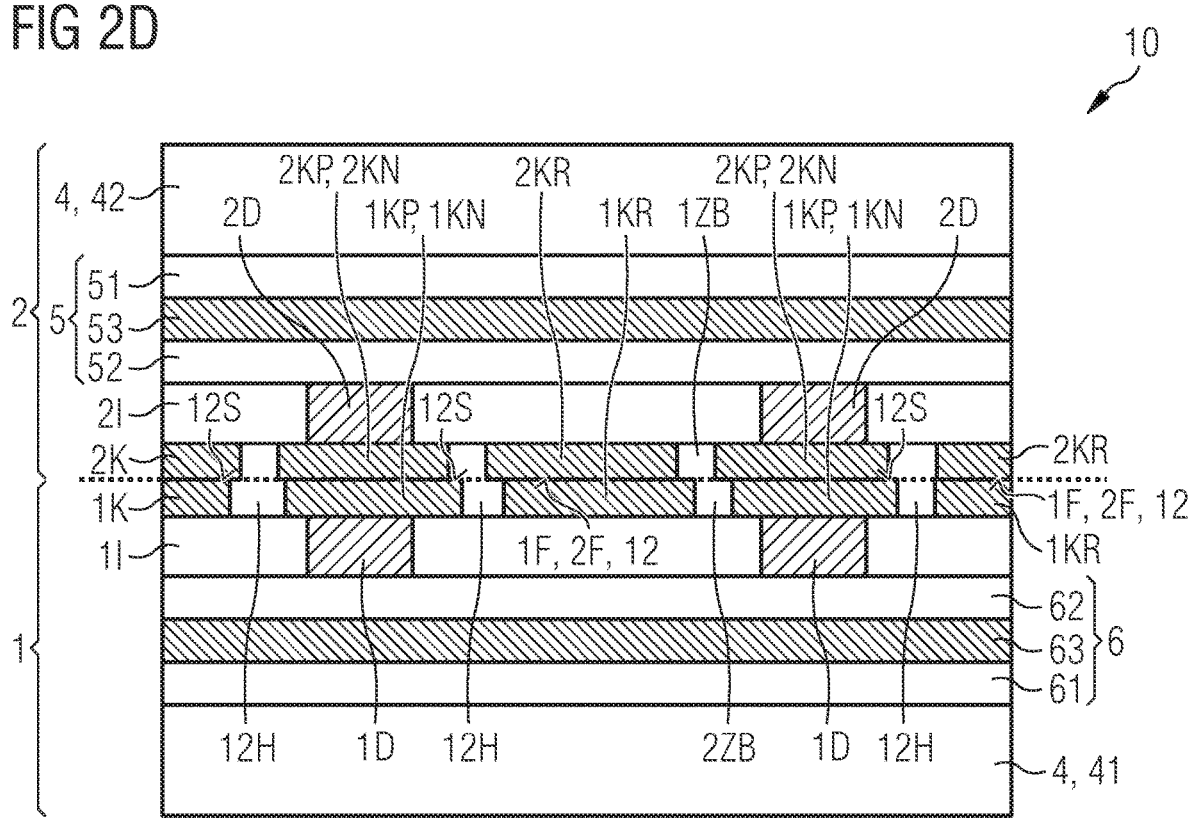

The exemplary embodiment for a component 10 shown in FIG. 2D is essentially the same as the exemplary embodiment for a component 10 shown in FIG. 2B. In contrast, FIG. 2D explicitly shows that the component part 1 and 2 each have a carrier 41 or 42 and a semiconductor body 5 or 6.

The semiconductor body 6 is electrically conductively connected to the semiconductor body 5, in particular via the first through-vias 1D, the contact layers 1K and 2K and via the second through-vias 2D. The semiconductor bodies 5 and 6 can be connected in series, parallel or antiparallel to each other. The semiconductor body 6 can have a first semiconductor layer 61, a second semiconductor layer 62 and an active zone 63 located therebetween. It is possible that the active zone 53 and the active zone 63 are each configured to generate electromagnetic radiation. For example, the active layers 53 and 63 are configured to generate electromagnetic radiation of different wavelengths. It is also conceivable that the semiconductor bodies 5 and 6 are connected antiparallel to each other so that the semiconductor body 5 serves in particular as a protective diode for the semiconductor body 6, or vice versa.

Figure 3A:
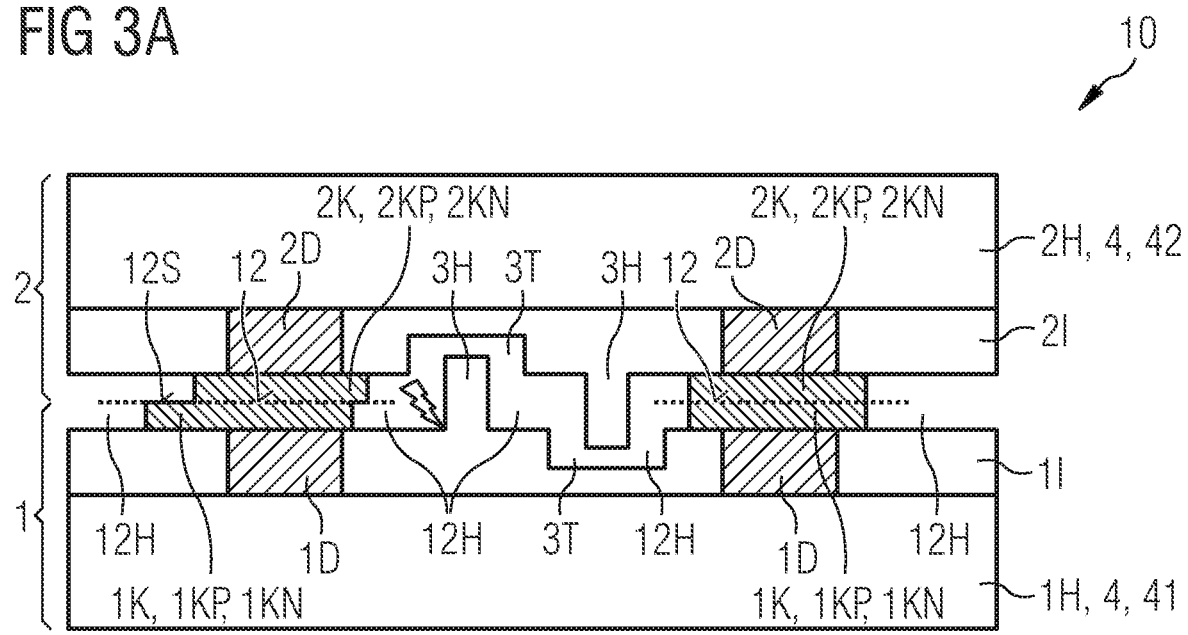

The exemplary embodiment shown in FIG. 3A is essentially the same as the exemplary embodiment for a component 10 shown in FIG. 2B. In contrast, the first insulating layer 1I and the second insulating layer 2I have local vertical elevations 3H and/or vertical recesses 2T. The local recesses 3T and/or the local elevations 3H are especially arranged in a cavity 12H, wherein the cavity 12H is arranged in the lateral direction between the subregions 1KP and 1KN of the first contact layer 1K or between the subregions 2KP and 2KN of the second contact layer 2K. The subregions 1KP and 1KN or 2KP and 2KN can be assigned to different electrical polarities of the component 10. The vertical elevations 3H and/or the recesses 3T in the cavity 12H effectively prevent an electrical breakdown.

According to FIG. 3A, dielectric strength can be assured by maintaining a minimum lateral distance between the through-vias 1D or 2D, or between the subregions 1KP and 1KN of the first contact layer 1, or between the 2KP and 2KN subregions of the second contact layer 2. The dielectric strength can be improved by the presence of the cavity 12H, which is especially filled with air or an inert gas. If the bonding is performed in a vacuum environment, the cavity can be a vacuum-like space that is of particular high dielectric strength. In addition, the dielectric strength of component 10 can be further increased by the presence of the local recesses 3T and/or the local elevations 3H.

Figure 3B:
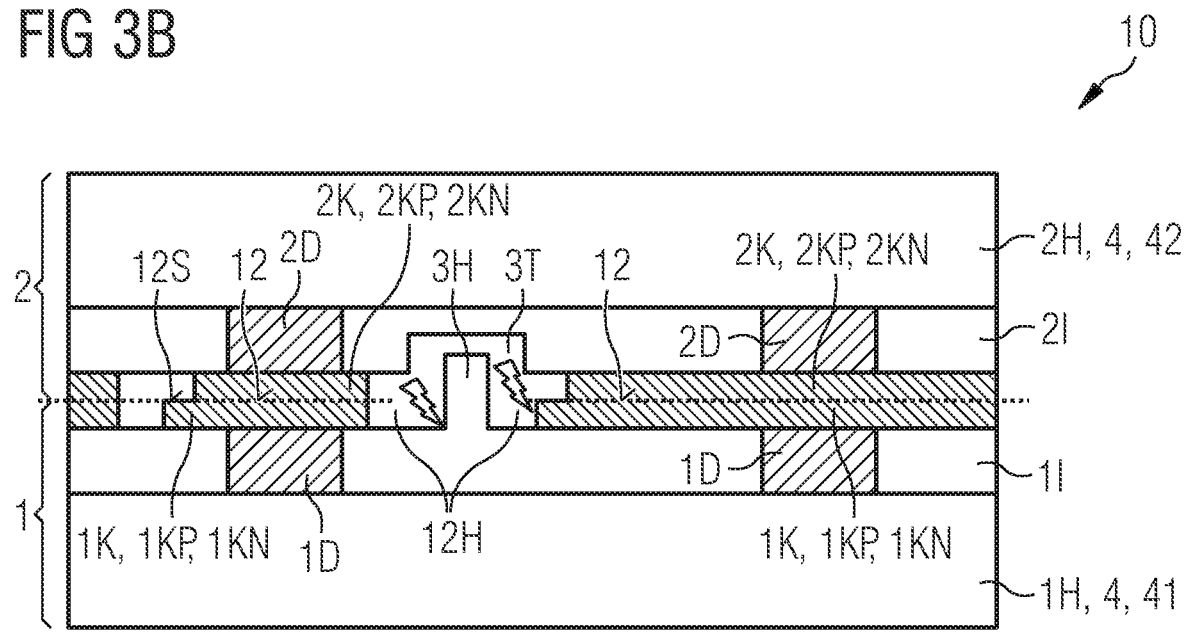

The exemplary embodiment shown in FIG. 3B essentially corresponds to the exemplary embodiment of a component 10 shown in FIG. 3A. In contrast, the first insulating layer 1I only has one or more elevations 3H. The second insulating layer 2I has at least one or more recesses 3T. In particular, the vertical elevation 3H extends into the recess 3T.

Figure 3C:
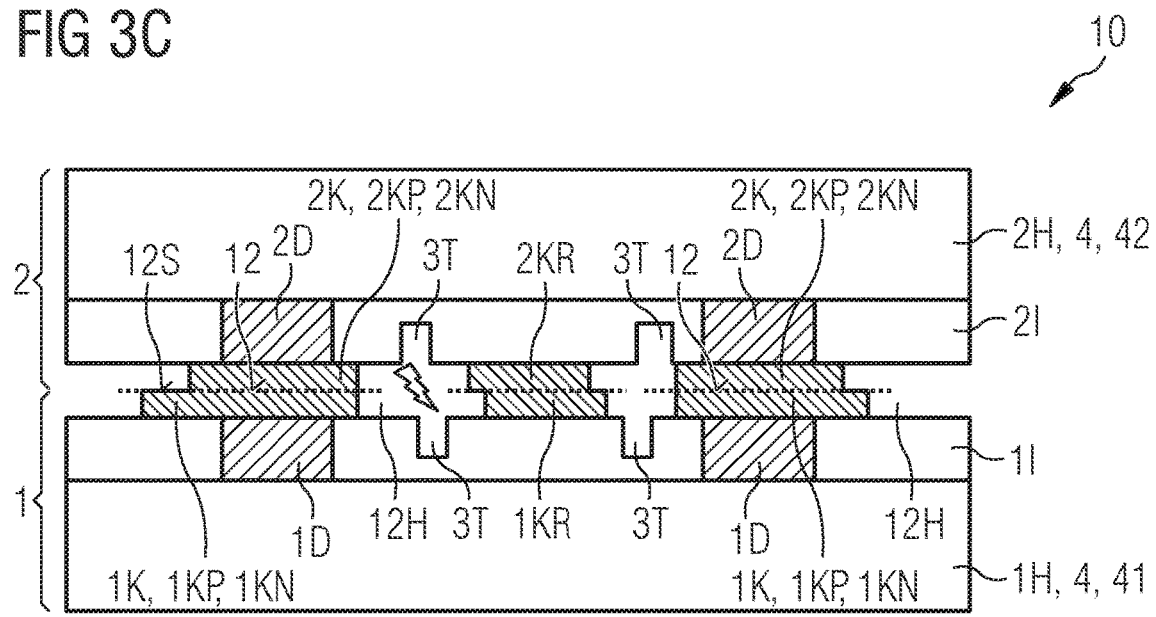

The exemplary embodiment shown in FIG. 3C essentially corresponds to the exemplary embodiment of a component 10 shown in FIG. 3A. In contrast, the first insulating layer 1I and the second insulating layer 2I can have local recesses 3T exclusively.

In all exemplary embodiments, the intermediate region 1ZB or 2ZB can have a lateral width between 1 µm and 10 µm inclusive, for example between 1 µm and 4 µm inclusive or between 4 µm and 10 µm inclusive. In particular, a lateral distance between the subregions of the contact layers 1K or 2K is at least 1 µm, preferably at least 4 µm or at least 7 µm. The cavity 12H between the subregions of the first contact layer 1K or the second contact layer 2K can have a lateral width between 1 µm and 20 µm, for example between 2 µm and 8 µm or between 8 µm and 20 µm. The first contact layer 1K and/or the second contact layer 2K can have a vertical layer thickness between 2 nm and 20 nm, for instance between 2 nm and 10 nm or between 10 nm and 20 nm. The local recess 3T and/or the local elevation 3H can/can have a vertical extension between 2 nm and 30 nm, for instance between 2 nm and 20 nm or between 2 nm and 10 nm.

Figure 4:
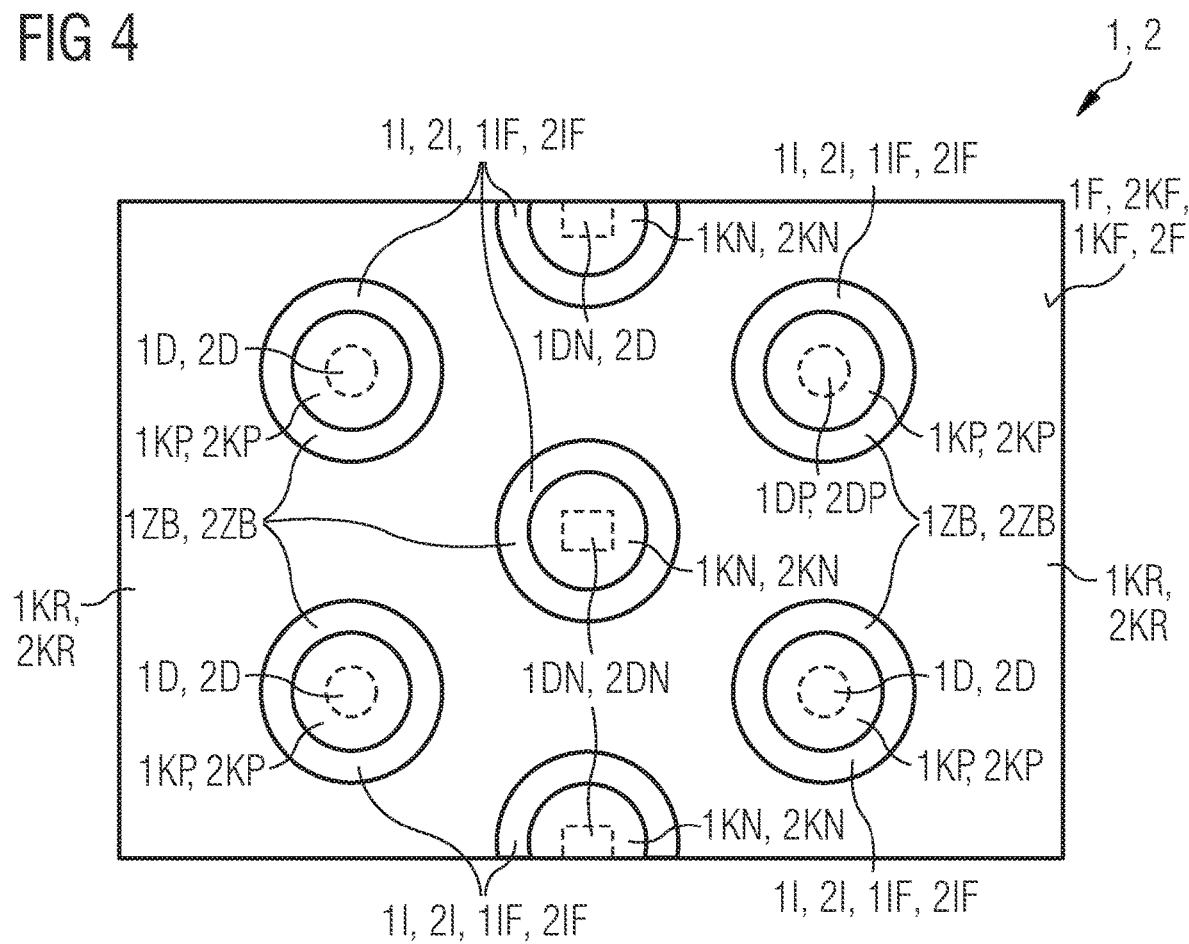
FIG. 4 shows another exemplary embodiment of the first and/or the second component part in top view of the exposed surface of the contact layer or of the insulating layer.

The exemplary embodiment shown in FIG. 4 is essentially the same as the exemplary embodiment shown in FIG. 1A of a first component part 1 or of a second component part 2. In contrast, the contact layer 1K/2K has a contiguous subregion 1KR/2KR, which in particular does not cover any of the through-vias 1D/2D. The contiguous subregion 1KR or 2KR can be electrically neutral. In other words, the contiguous subregion 1KR or 2KR is in particular not formed for electrically contacting the first component part 1 or the second component part 2 or the component 10.

The first contact layer 1K can have a plurality of further subregions 1KP and 1KN. The further subregions 1KP and 1KN are each completely enclosed in the lateral direction by an intermediate region 1ZB. In the intermediate region 1ZB, the first insulating layer 1I is freely accessible. In other words, the first insulating layer 1I in the intermediate region 1ZB is not covered by the first contact layer 1K. The further subregions 1KP and 1KN are especially assigned to different electrical polarities of the component part 1 and component 10, respectively. In a plan view, the first subregion 1KP can completely cover a through-via 1D, wherein the first through-via 1D can be formed as a p-sided through-via 1DP, for example. The further subregion 1KN can completely cover another through-via 1D in a plan view, which is especially formed as n-sided through-via 1DN.

According to FIG. 4, the second component part 2 having the second contact layer 2K can be formed analogous to the component part 1 having the first contact layer 1K shown in FIG. 4. As the contiguous subregion 1KR or 2KR laterally encloses the subregions 1KN and 1KP or 2KN and 2KP and can be formed electrically neutral, the dielectric strength of component 10 can be significantly increased.

This patent application claims the priority of the German patent application 10 2018 112 586.0, the disclosure content of which is hereby included by reference.

The invention is not restricted to the exemplary embodiments by the description of the invention made with reference to exemplary embodiments. The invention rather comprises any novel feature and any combination of features, including in particular any combination of features in the claims, even if this feature or this combination is not itself explicitly indicated in the claims or exemplary embodiments.

The invention claimed is:

1. A method for producing a mechanical and electrical connection between a first component part and a second component part, the method comprising:
   providing the first component part with a partially exposed first insulating layer, a plurality of first through-vias and an exposed first contact layer structured in places and planarized in places, wherein the first through-vias are each laterally enclosed by the first insulating layer, and wherein the first contact layer partially covers the first insulating layer and completely covers the first through-vias;
   providing the second component part with a partially exposed second insulating layer, a plurality of second through-vias and an exposed second contact layer structured in places and planarized in places, wherein the second through-vias are each laterally enclosed by the second insulating layer, and wherein the second contact layer partially covers the second insulating layer and completely covers the second through-vias; and joining the component parts such that, in a plan view, the contact layers overlap each other thereby mechanically and electrically connecting the component parts to each other by a direct bonding process at the contact layers which are planarized in places, wherein an exposed surface of the first component part is formed exclusively of surfaces of the first contact layer and of the first insulating layer, the first contact layer directly adjoining the first insulating layer, wherein an exposed surface of the second component part is formed exclusively of surfaces of the second contact layer and of the second insulating layer, the second contact layer directly adjoining the second insulating layer, and wherein, when the component parts are joined together, a common interface is formed between the component parts, the common interface being a common connection plane formed exclusively by overlapping of the planarized surfaces of the first and second contact layers.

2. The method according to claim 1,
wherein, at least locally, the first contact layer vertically projects beyond exposed regions of the first insulating layer, the exposed regions being laterally directly adjacent to the first contact layer, and/or
wherein, at least locally, the second contact layer vertically projects beyond exposed regions of the second insulating layer, the exposed regions being laterally directly adjacent to the second contact layer.

3. The method according to claim 1, wherein each component parts has a main body, the main body comprising a carrier and/or a semiconductor body.

4. The method according to claim 1, wherein the first insulating layer and/or the second insulating layer are/is planarized at least in places.

5. The method according to claim 1, wherein the first insulating layer and/or the second insulating layer are/is planarized in places and have/has local recesses or local elevations in places.

6. The method according to claim 1, wherein each of the first contact layer and the second contact layer has a laterally extending planarized surface with an average roughness of at most 3 nm.

7. The method according to claim 1, wherein the through-vias are formed from a metal and the contact layers are formed from a transparent electrically conductive material.

8. The method according to claim 1, wherein the mechanical connection between the first component part and the second component part is based on van-der-Waals interactions, wherein the first contact layer directly adjoins the second contact layer, and wherein a common interface is formed between the in places planarized contact layers and is free of a connecting material.

9. The method according to claim 1, wherein the first contact layer and the second contact layer have a plurality of laterally spaced subregions, wherein intermediate regions are arranged in lateral directions between the subregions, and wherein the first insulating layer or the second insulating layer is exposed in the intermediate regions.

10. The method according to claim 1, wherein cavities are formed in a vertical direction between the first component part and the second component part.

11. A component comprising:
a first component part; and
a second component part,
wherein the first component part has a first insulating layer, a plurality of first through-vias and a first contact layer structured in places, the first through-vias each being laterally enclosed by the first insulating layer, and the first contact layer directly adjoining the first insulating layer, partially covering the first insulating layer and completely covering the first through-vias, wherein the second component part has a second insulating layer, a plurality of second through-vias and a second contact layer structured in places, the second through-vias each being laterally enclosed by the second insulating layer, and the second contact layer directly adjoining the second insulating layer, partially covering the second insulating layer and completely covering the second through-vias, wherein a mechanical and electrical connection is formed between the component parts at the contact layers, wherein a common interface is located between the component parts, and wherein the common interface is a common connection plane formed exclusively by overlapping the planarized surfaces of the first contact layer and of the second contact layer.

12. The component according to claim 11,
wherein cavities are arranged in a vertical direction between the first component part and the second component part,
wherein, in sectional view, each cavity has a shape of a step, and/or
wherein the cavities laterally enclose a subregion of the contact layers and the subregion completely covers at least one of the through-vias.

13. The component according to claim 11,
wherein at least one cavity is located in vertical direction between the first component part and the second component part,
wherein the cavity is located in lateral direction between two adjacent subregions of the contact layers, and
wherein the cavity is so wide that an electrical breakdown between the two adjacent subregions is prevented.

14. The component according to claim 11, wherein the first insulating layer and/or the second insulating layer have/has at least one local recess or at least one local elevation, the local recess or elevation being located in a cavity between the component parts.

15. The component according to claim 14, wherein the local elevation of one insulating layer extends into the local recess of the other insulating layer.

16. The component according to claim 11, wherein the first contact layer or the second contact layer has a contiguous subregion and a plurality of further subregions, each further subregions being enclosed in lateral directions by the contiguous subregion.

17. The component according to claim 16, wherein the contiguous subregion is assigned to a first electrical polarity of the component and the further subregions are assigned to a second electrical polarity of the component different from the first electrical polarity.

18. The component according to claim 16,
wherein the contiguous subregion is electrically neutral,
wherein some of the further subregions are assigned to a first electrical polarity of the component, and
wherein some of the further subregions are assigned to a second electrical polarity of the component different from the first electrical polarity.

19. A component comprising:
a first component part; and
a second component part, wherein the first component part has a first insulating layer, a plurality of first through-vias and a first contact layer structured in places, the first through-vias each being laterally enclosed by the first insulating layer and the first contact layer partially covering the first insulating layer and completely covering the first through-vias, wherein the second component part has a second insulating layer, a plurality of second through-vias and a second contact layer structured in places, the second through-vias each being laterally enclosed by the second insulating layer and the second contact layer partially covering the second insulating layer and completely covering the second through-vias, wherein a mechanical and electrical connection is formed between the component parts at the contact layers, wherein the first insulating layer and/or the second insulating layer have/has at least one local recess or at least one local elevation, the local recess or the local elevation being located in a cavity between the component parts, and wherein, due to a presence of the local recess or the local elevation of the first and/or of the second insulating layer, the cavity is branched or stepped in places for preventing an electrical breakdown between adjacent subregions of the first and second contact layers.

20. The component according to claim 19, wherein the local elevation of one insulating layer extends into the local recess of the other insulating layer.

\* \* \* \* \*